United States Patent [19]
Ziger et al.

[11] Patent Number: 5,762,688
[45] Date of Patent: Jun. 9, 1998

[54] PARTICLE REMOVAL WAFER

[75] Inventors: David H. Ziger; Pierre Leroux, both of San Antonio, Tex.

[73] Assignee: VLSI Technology, Inc., San Francisco, Calif.

[21] Appl. No.: 632,352

[22] Filed: Apr. 10, 1996

[51] Int. Cl.$^6$ .................................................. B01D 47/14
[52] U.S. Cl. ................................ 95/212; 95/237; 55/282
[58] Field of Search ........................ 428/156, 167, 428/172; 95/212, 237; 430/328; 34/306; 55/282, 490; 401/196, 261

[56] References Cited

U.S. PATENT DOCUMENTS 5,344,693  9/1994  Sanders ................................. 428/167

*Primary Examiner*—Donald Loney
*Attorney, Agent, or Firm*—Majestic, Parsons, Siebert & Hsue P.C.

[57] ABSTRACT

A particle removal wafer including ridges defining recessed areas and sticky material placed in these recessed areas can be run through wafer processing equipment. The particle removal wafer can remove particles that would otherwise adhere to the backs of wafers run through this equipment. Particles adhering to the backs of wafers are a problem in the photolithographic steps. These particles cause the focus of the photolithographic system to be off and thus can cause fatal errors. By removing the particles which could adhere to the backs of wafers from the wafer fabrication equipment, the accuracy of the photolithographic process can be improved.

8 Claims, 4 Drawing Sheets

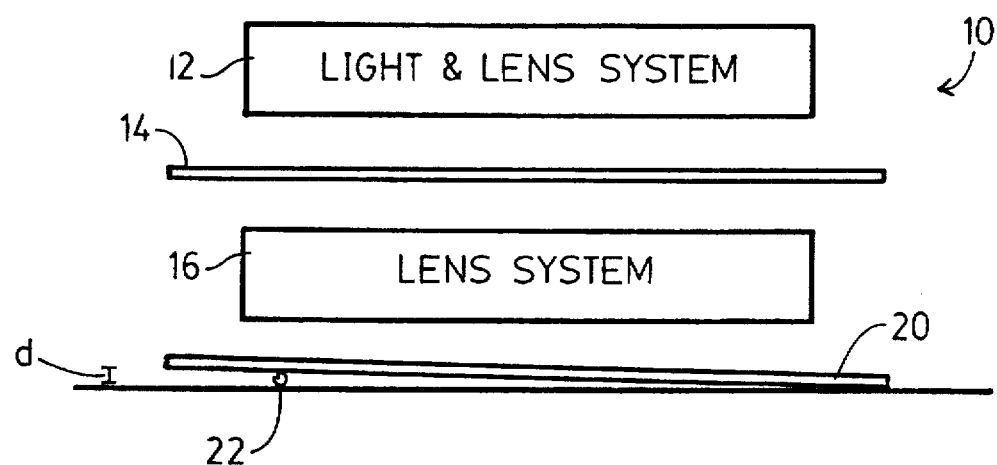
FIG._1.
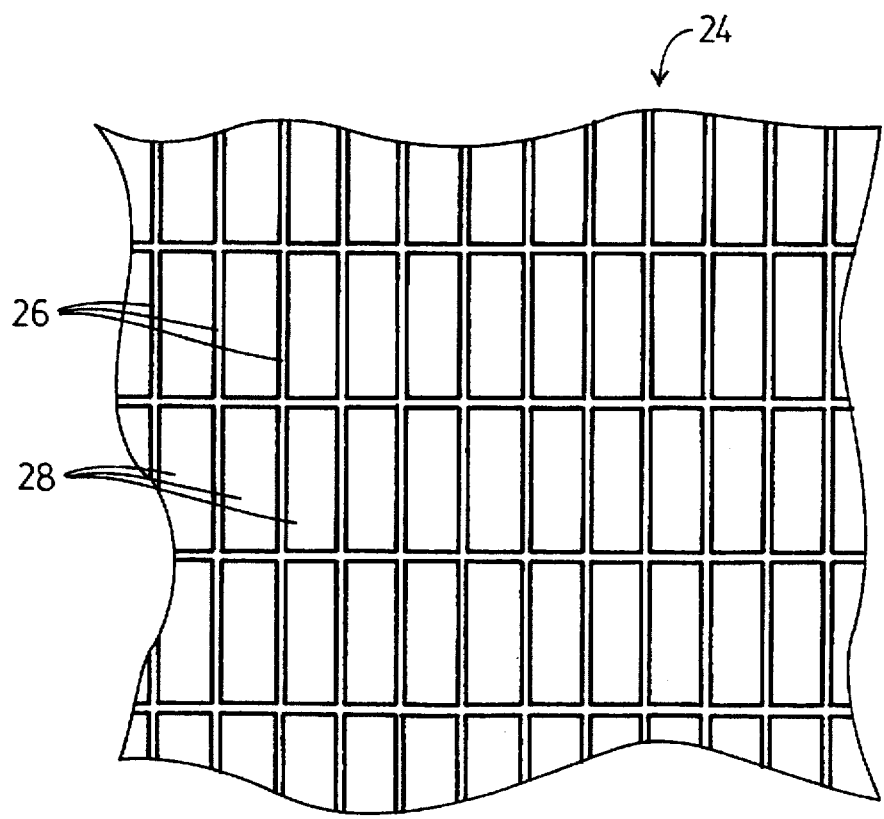
FIG._2A.

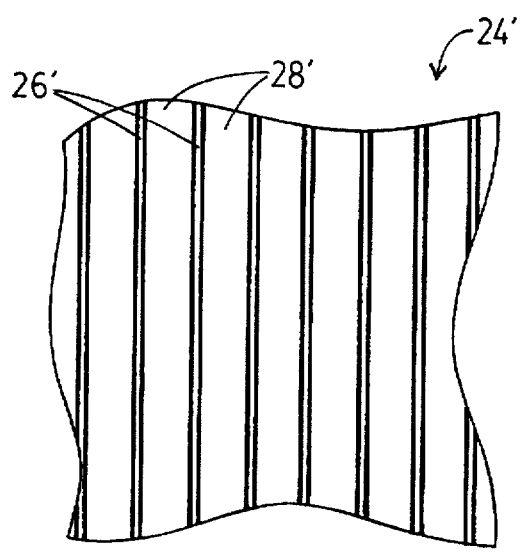
FIG._2B.
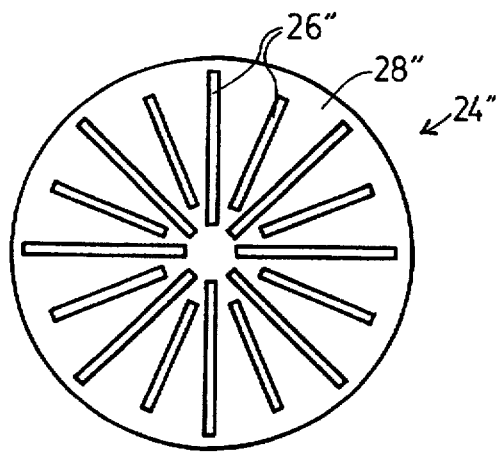
FIG._2C.
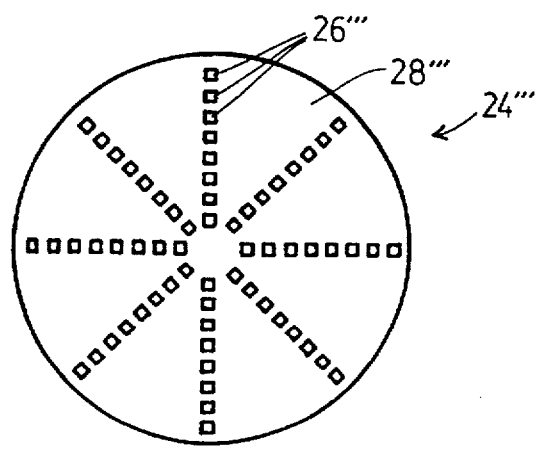
FIG._2D.

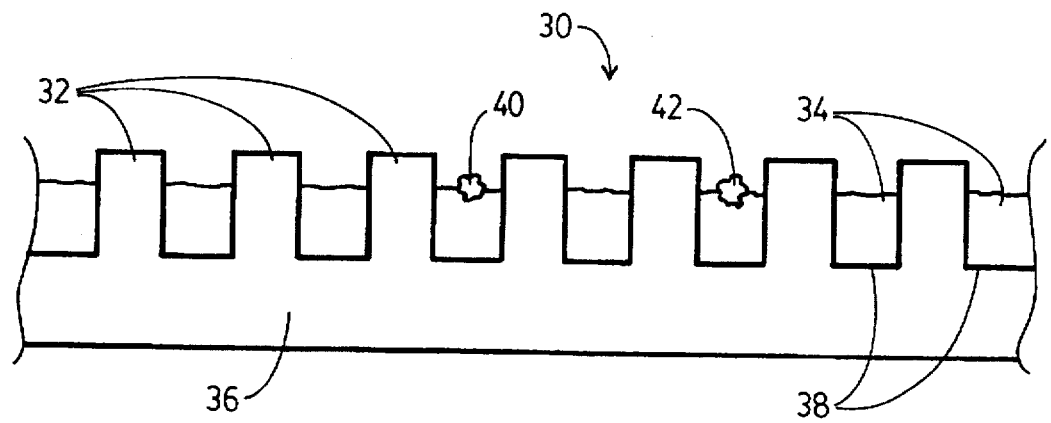
FIG._3.
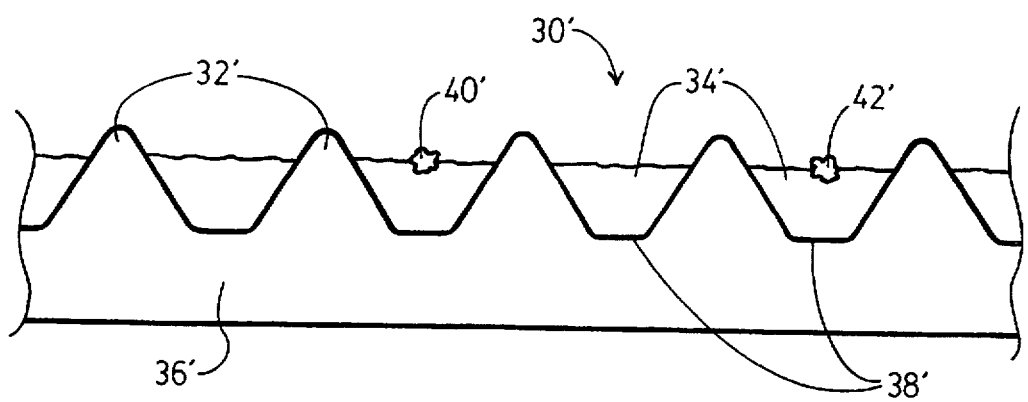
FIG._4.

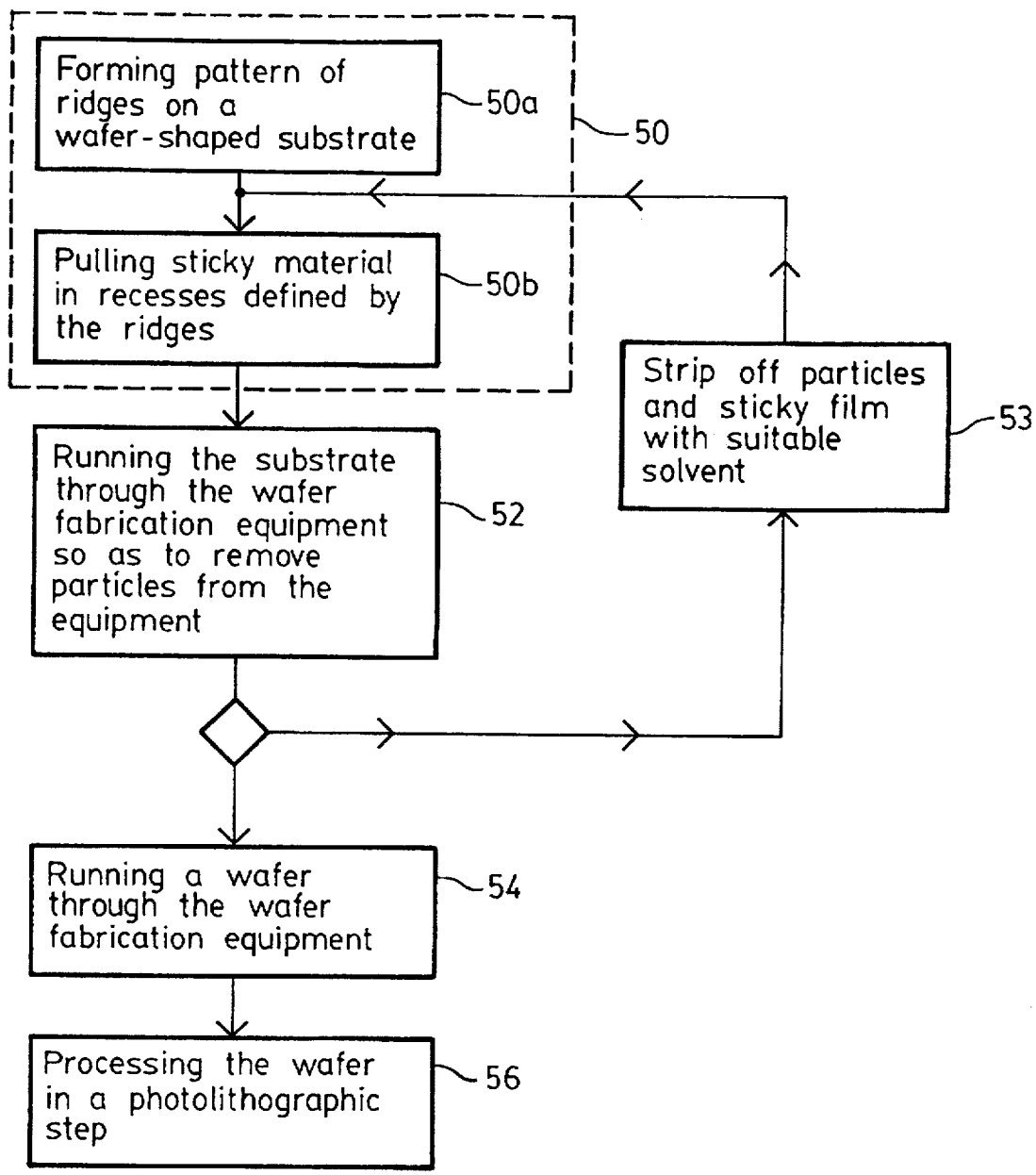
FIG._5.

PARTICLE REMOVAL WAFER

BACKGROUND OF THE INVENTION

The present invention relates to methods of improving photolithography processes. A common problem currently occurring in photolithography processes involves the adhesion of particles to the back of wafers.

FIG. 1 is a diagram of a photolithographic system 10. This system includes a light-producing and lens system 12, mask 14 and an additional lens system 16. Using the photolithographic system 10, a pattern on the mask 14 can be imaged onto a wafer 20 using photoresist material (not shown) placed on top of the wafer 20. Because of the precision required with current photolithography systems, the focal length of the photolithography system 10 can be as small as one micron or less. This means that a small particle 22 of even a half a micron in diameter can cause a displacement, d, such that the photolithographic system 10 is so out of focus on the surface of the wafer 20 that the correct pattern is not formed on the photoresist (not shown). This will result in the complete failure of the process such that the desired circuit is not formed on the wafer 20.

In the past, the removal of particles from the back of wafers has involved attempts to clean the surfaces contacting the wafer with cloths, alcohol, grindstones, and the like.

The disadvantage of these methods is that often the particles are not completely removed. Thus, the wafers must be cleaned and checked multiple times before the photolithographic processes. This prior art cleaning process interrupts the flow of material through the stepper.

It is desired to have an improved method of avoiding particles from adhering to the back of wafers which can cause a problem in photolithographic processes.

SUMMARY OF THE INVENTION

By using a special particle removal wafer sent through the wafer processing equipment, particles in the wafer processing equipment that would otherwise adhere to the back of wafers can be trapped and removed from the equipment.

The particle removal wafer of the present invention involves a substrate on which ridges have been formed. These ridges define recessed areas in which sticky material is placed.

These particle removal wafers are run through the wafer processing equipment facing the direction that the backs of wafers usually face. The ridges extend above the sticky material and prevent the sticky material from contacting the wafer processing equipment. Particles that would ordinarily adhere to the back of wafers going through the system are now trapped by the sticky material in the recessed areas.

The particle removal wafer needs to have ridges which are strong enough to support the wafer in the wafer processing equipment. These ridges are preferably relatively pointy so that dust will not adhere to the ridge portion, but will roll off. Additionally, relatively pointy ridges allow for easier placement of the sticky material in the recesses.

In one embodiment, the substrate is made of a silicon wafer that is etched using standard photolithographic processes to produce the ridges and recessed areas. The sticky material can be unbaked photoresist that is spun on and then cleaned off of the ridges.

After the particle removal wafer is run through the wafer processing equipment, the regular wafers can be sent through the wafer processing equipment. Since the equipment is at least partially cleaned of particles by the particle removal wafer, fewer, if any, particles will adhere to the back of the wafers as they go through the system. Thus, the problem of particles adhering to the back of the wafers in the photolithographic processes is reduced or avoided.

BRIEF DESCRIPTION OF THE DRAWINGS

The above and other features and aspects of the present invention will become more apparent upon reading the following detailed description in conjunction with the accompanying drawings, in which:

FIG. 1 is a diagram of a photolithographic system.

FIG. 2A is a partial diagram of a particle removal wafer showing ridges and recessed areas.

FIG. 2B is a partial diagram of an alternate embodiment of a particle removal wafer showing ridges and recessed areas.

FIG. 2C is a diagram of a particle removal wafer showing ridges arranged in a radial pattern.

FIG. 2D is a diagram of an alternate embodiment of a particle removal wafer showing ridges arranged in a radial pattern.

FIG. 3 is a cross-sectional view of a portion of a particle removal wafer showing ridges and recessed areas including sticky material.

FIG. 4 is a cross-sectional view of an alternate embodiment of a particle removal wafer showing the ridges and recessed areas including sticky material.

FIG. 5 is a flow chart showing the method of the present invention.

DETAILED DESCRIPTION OF THE PREFERRED EMBODIMENT

FIG. 2A is a partial diagram of a particle removal wafer 24 of the present invention. This view shows ridges 26 and recessed areas 28. The design of the ridges 26 on the particle removal wafer is done so as to support the wafer in the wafer processing equipment. The ridges 26 should have a thickness such that the ridges 26 will not snap off.

Some alternate designs for the particle removal wafer are given in FIGS. 2B–2D. Preferred patterns minimize the sticky material build-up and minimize the non-collecting (ridge) surface.

FIG. 3 is a partial cross-sectional view of a particle removal wafer 30 showing the ridges 32 and sticky material 34. The ridges 32 define recessed areas 38 on the substrate 36. A sticky material 34 can be placed in these recessed areas. The sticky material 34 is preferably placed in the recessed area 38 such that it does not extend above the ridges 32. The substrate 36 including the ridges 32 can be made of a silicon semiconductor wafer material which can be etched to form the ridges 32. Alternately, a metal material such as stainless steel or titanium could be used.

Whatever material is used for the substrate 36, it is preferable that it be a type of material which is typically found in the cleanroom environment so that the substrate material does not cause a problem as it passes through the wafer processing equipment. Additionally, the material should be such that the ridges 32 are hard so as to avoid breakage.

The sticky material 34 can be an unbaked photoresist material. Alternately, the sticky material 34 could be a thick resin such as a resin "B" or a glue material. The sticky material is preferably a type of material that remains sticky for a relatively long period of time and will not fall out of the recessed areas 38. The sticky material needs to be contaminant-free. As the particle removal wafer 30 is moved through the wafer processing equipment, particles such as particles 40 and 42 become trapped in the sticky material 34. The sticky material should be such that a commercial solvent is available to clean off the sticky material and particles from the particle removal wafer.

Alternately, rather than using a sticky material in the recessed areas, the ridges can be spaced so close together that particles get trapped between them. This requires a relatively vertical ridge wall.

FIG. 4 is a partial cross-sectional view of an alternate embodiment of a particle removal wafer 30' of the present invention. In this alternate embodiment, the ridges 32' are relatively pointy so that the particles will not adhere to the tops of the ridges 32'. The relatively pointy ridges 32' also make it easier for the sticky material 34' to not stick to the top of the ridges 32' when the sticky material 34' is placed in the recessed areas 38'. A relatively pointy-shaped ridge 32' is formed in the etching of the wafer 36' in a photolithographic process. For example, the pattern can be a complementary pattern of the stepper chuck.

FIG. 5 shows a flow chart showing the method of the present invention. Step 50 comprises providing a particle removal wafer. This step includes a sub-step 50a of forming a pattern of ridges on a wafer-shaped substrate in sub-step 50a. This step can be comprised of etching a silicon wafer or forming a pattern of ridges on a metal wafer-shaped substrate or another material. In sub-step 50b, sticky material is placed in the recesses defined by the ridges on the wafer-shaped substrate. This step can be done by spinning a photoresist onto the substrate. The photoresist will not adhere well to the pointy ridges 32' shown in the alternate embodiment of FIG. 4. Looking again at FIG. 5, the photoresist can be removed from the ridge area by a light de-scum, squirting of a little bit of developer over the wafer, or by lightly scraping the top of the wafer. Alternately, another type of sticky material can be used, such as a resin or a glue. As discussed above, it is preferable that the sticky material be placed in the recesses such that the ridges extend above the sticky material.

Step 52 involves running the substrate through the wafer fabrication equipment so as to remove particles from the equipment. This step can be done so that the side of the substrate with the sticky material and the ridges is facing the direction the backs of the wafers normally face as the wafers are sent through the wafer fabrication equipment. In this way, particles that would otherwise adhere to the back of wafers can be trapped in the sticky material and removed from the wafer processing equipment. Since the ridges extend above the sticky material, the ridges will touch the wafer processing equipment and the sticky material will not. Examples of wafer processing equipment that the particle removal wafer can be used with include the stepper chuck, resist applying equipment, etch equipment, and wafer handling equipment. The particle removal wafer is probably not usable with equipment that processes the wafers under high temperatures.

In step 54, a regular wafer is run through the wafer fabrication equipment. As discussed above, the backs of the regular wafers face the areas that have been cleaned by the sticky material on the particle removal wafer. Alternately, rather than going directly to step 54, the sticky film and particles can be stripped from the wafer with a suitable solvent in step 53 and steps 50b and 52 repeated.

In step 56, the regular wafer is processed in a photolithographic step. Since the particles which would normally adhere to the back of the wafer are removed, the wafer is correctly aligned in the photolithographic step, and critical errors can be avoided.

Various details of the implementation and method are merely illustrative of the invention. It will be understood that the various changes in such details may be within the scope of the invention, which is to be limited only by the appended claims.

What is claimed is:

1. A method of cleaning wafer-fabrication equipment including:

providing a rigid wafer-shaped substrate including ridges that define recessed areas on the substrate and including sticky material placed in the recessed areas; and running the wafer-shaped substrate through the wafer-fabrication equipment so that particles in the wafer-fabrication equipment are trapped by the sticky material, the running step being done such that the ridges contact the wafer-processing equipment and not the sticky material.

2. The method of claim 1, wherein the running step is done so that the sticky material is facing towards surfaces on the wafer-fabrication equipment that the backs of the wafers would usually face so that particles that could otherwise adhere to the back of a wafer are trapped by the substrate.

3. The method of claim 1, further comprising the step of running a semiconductor wafer though the wafer processing equipment after the running step.

4. The method of claim 1, wherein the providing step includes etching the substrate to form the ridges and recessed areas.

5. The method of claim 1, wherein the providing step comprises placing a sticky material on the substrate and cleaning the sticky material off of the ridges.

6. The method of claim 5, wherein the providing step comprises spinning a photoresist material onto the substrate.

7. The method of claim 1, wherein the running step is such that the substrate is moved through the wafer handling equipment by a wafer handler.

8. A method of cleaning wafer-fabrication equipment including:

providing a rigid wafer-shaped substrate including ridges that define recessed areas on the substrate and include sticky material provided in the recessed areas;

running the wafer-shaped substrate through the wafer-fabrication equipment so that particles in the wafer-fabrication are trapped by the sticky material, the running step being done such that the ridges contact the wafer-processing equipment, the ridges facing towards surfaces on the wafer-fabrication equipment that the backs of the wafers would usually face so that particles that could otherwise adhere to the back of a wafer are trapped by the sticky material.

* * * * *